(12) United States Patent
Ha et al.

(10) Patent No.: US 8,481,420 B2
(45) Date of Patent: Jul. 9, 2013

(54) INTEGRATED CIRCUIT PACKAGING SYSTEM WITH LEAD FRAME STACKING MODULE AND METHOD OF MANUFACTURE THEREOF

(75) Inventors: Jong-Woo Ha, Seoul (KR); DaeSik Choi, Seoul (KR); Byoung Wook Jang, Yong-in (KR)

(73) Assignee: STATS Chippac Ltd., Singapore (SG)

( * ) Notice: Subject to any disclaimer, the term of this patent is extended or adjusted under 35 U.S.C. 154(b) by 162 days.

(21) Appl. No.: 13/048,859

(22) Filed: Mar. 15, 2011

(65) Prior Publication Data

US 2012/0235307 A1    Sep. 20, 2012

(51) Int. Cl.
*H01L 21/44* (2006.01)
*H01L 21/48* (2006.01)

(52) U.S. Cl.
USPC ........... 438/617; 438/109; 438/112; 438/127; 257/E21.614

(58) Field of Classification Search
USPC ........... 438/617, 109, 112, 127; 257/E21.614
See application file for complete search history.

(56) References Cited

U.S. PATENT DOCUMENTS

| | | | |
|---|---|---|---|
| 6,239,480 B1 | 5/2001 | MacPherson et al. | |
| 7,008,822 B2 * | 3/2006 | Bolken et al. | 438/109 |
| 7,101,731 B2 * | 9/2006 | Karnezos | 438/107 |
| 7,253,511 B2 | 8/2007 | Karnezos et al. | |
| 7,372,141 B2 * | 5/2008 | Karnezos et al. | 257/686 |
| 7,429,787 B2 * | 9/2008 | Karnezos et al. | 257/686 |
| 7,635,917 B2 | 12/2009 | Wang et al. | |
| 2006/0043556 A1 * | 3/2006 | Su et al. | 257/686 |
| 2006/0197209 A1 * | 9/2006 | Choi et al. | 257/686 |
| 2006/0267175 A1 * | 11/2006 | Lee | 257/686 |
| 2008/0150064 A1 | 6/2008 | Zimmerman et al. | |
| 2008/0251906 A1 * | 10/2008 | Eaton et al. | 257/686 |
| 2009/0166834 A1 * | 7/2009 | Yoon et al. | 257/686 |
| 2009/0179319 A1 * | 7/2009 | Lee | 257/686 |
| 2009/0309204 A1 * | 12/2009 | Ha | 257/686 |
| 2010/0059873 A1 * | 3/2010 | Chow et al. | 257/686 |

* cited by examiner

*Primary Examiner* — Nitin Parekh
(74) *Attorney, Agent, or Firm* — Ishimaru & Associates LLP

(57) ABSTRACT

A method of manufacture of an integrated circuit packaging system includes: providing an integrated circuit die having an active side and a passive side; providing a contact pad having a top side oriented in a same direction as the passive side; connecting an inner bond wire to the contact pad and the integrated circuit die; and molding a stacking structure around the contact pad, the inner bond wire, and the integrated circuit die with the passive side and the top side exposed, and the stacking structure having a top structure surface on top and adjacent to or below the integrated circuit die, and a horizontal member under the integrated circuit die and forming a cavity.

5 Claims, 4 Drawing Sheets

INTEGRATED CIRCUIT PACKAGING SYSTEM WITH LEAD FRAME STACKING MODULE AND METHOD OF MANUFACTURE THEREOF

TECHNICAL FIELD

The present invention relates generally to integrated circuit packaging system, and more particularly to an integrated circuit packaging system having lead frame internal stacking module.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, IC packages that are incorporated into these devices are required to be made smaller and thinner. The package configurations that house and protect IC require them to be made smaller and thinner as well.

In response to the demands for improved packaging, many innovative package designs have been conceived and brought to market. The multi-chip module has achieved a prominent role in reducing the board space used by modern electronics. However, multi-chip modules, whether vertically or horizontally arranged, can also present problems because they usually must be assembled before the component chips and chip connections can be tested. That is, because the electrical bond pads on a die are so small, it is difficult to test die before being fully assembled. Thus, when die are mounted and connected individually, the die and connections can be tested individually, and only known-good-die ("KGD") that is free of defects is then assembled into larger circuits. A fabrication process that uses KGD is therefore more reliable and less prone to assembly defects introduced due to bad die. With conventional multi-chip modules, however, the die cannot be individually identified as KGD before final assembly, leading to KGD inefficiencies and assembly process yield problems.

Numerous package approaches stack multiple integrated circuit dice or package in package (PIP) or a combination. Other approaches include package level stacking or package on package (POP). Both concepts include stacking of two or more packages. KGD and assembly process yields are not an issue since each package can be tested prior to assembly, allowing KGD to be used in assembling the stack. But stacking integrated devices, package-in-package, package-on-package, or combinations thereof have assembly process difficulties caused by leaded packages having limited input and output (I/O) which limits its role 3D packaging. Current leaded packages also do not provide the flexibility to support the various integration and stacking options described earlier with the higher I/O count support.

Thus, a need still remains for an integrated circuit packaging system providing low cost manufacturing, improved yields, reduction of integrated circuit package dimensions, and flexible stacking and integration configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing an integrated circuit die having an active side and a passive side; providing a contact pad having a top side oriented in a same direction as the passive side; connecting an inner bond wire to the contact pad and the integrated circuit die; and molding a stacking structure around the contact pad, the inner bond wire, and the integrated circuit die with the passive side and the top side exposed, and the stacking structure having a top structure surface on top and adjacent to or below the integrated circuit die, and a horizontal member under the integrated circuit die and forming a cavity.

The present invention provides an integrated circuit packaging system including: an integrated circuit die having an active side and a passive side; an inner bond wire connected to the integrated circuit die; a contact pad connected to the inner bond wire with the contact pad having a top side oriented in the same direction as the passive side; and a stacking structure molded around the contact pad, the inner bond wire, and the integrated circuit die with the passive side and the top side exposed, and the stacking structure having a top structure surface on top and adjacent to or below the integrated circuit die, and a horizontal member under the integrated circuit die and forming a cavity.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
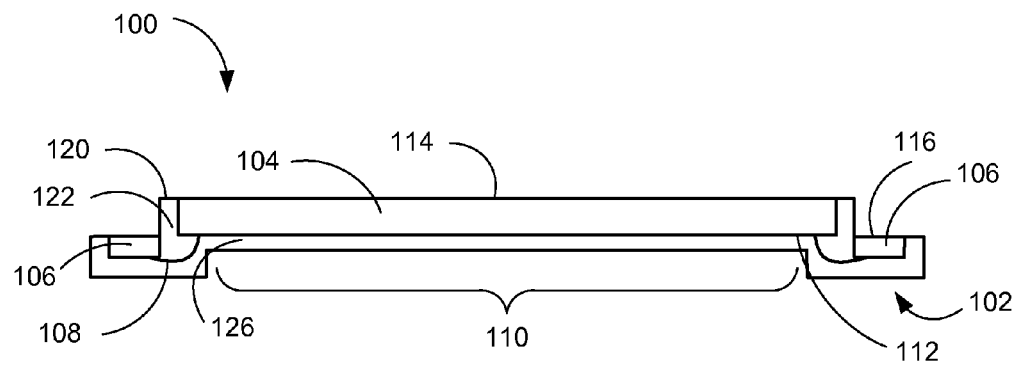
FIG. 1 is a cross-sectional view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact between elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a cross-sectional view of an integrated circuit packaging system 100 in a first embodiment of the present invention. The integrated circuit packaging system 100 has a stacking structure 102, an integrated circuit die 104, contact pads 106, and an inner bond wire 108.

The stacking structure 102 is a solid structure that holds the integrated circuit die 104 in place. The stacking structure 102 can be made from various materials. For example, the stacking structure 102 can be formed by molding plastic, epoxy, or resin type of material. Also, for example, the stacking structure 102 can be formed by shaping ceramic, composite, or other electrically non-conductive materials.

The stacking structure 102 can have a cavity 110. The cavity 110 is a space within a recessed portion of the stacking structure 102. The stacking structure 102 can have the cavity 110 on the opposite side of the integrated circuit die 104.

For illustrative purposes, the cavity 110 is shown as being in the center portion of the stacking structure 102 and having a size slightly smaller than the integrated circuit die 104. However, it is understood that the cavity 110 can be of different sizes and can be positioned differently. For example, the cavity 110 can be significantly larger or smaller than the integrated circuit die 104 and be positioned on one half or near the corner of the stacking structure 102.

The stacking structure 102 can be formed around the integrated circuit die 104, the contact pads 106, and the inner bond wire 108. The stacking structure 102 can affix the integrated circuit die 104, the contact pads 106, and the inner bond wire 108 relative to each other. In other examples, the stacking structure 102 can be formed using adhesive material or adhesive materials can be placed between the components and the stacking structure 102 to attach the integrated circuit die 104 and the contact pads 106. The method for forming the stacking structure 102 will be discussed in detail below.

The integrated circuit die 104 is a semi-conductive device that has all or portion of an electrical circuit contained within. The integrated circuit die 104 can have an active side 112 having active circuitry fabricated thereon and a passive side 114 opposite the active side 112. The stacking structure 102 can expose all or portion of the passive side 114 of the integrated circuit die 104 and cover all of the active side 112. The passive side 114 can be coplanar with a side of the stacking structure 102 exposing the passive side 114.

The contact pads 106 are a conductive material, such as copper or gold, or a set of layers having conductive property that can be used to relay electrical signals between components. For example, the contact pads 106 may function as input/output (IO) pads for the integrated circuit die 104. The contact pads 106 can have a top side 116 that is exposed from the stacking structure 102. The top side 116 can have the same orientation as the passive side 114 of the integrated circuit die 104.

The inner bond wire 108 is a conductive wire that connects the contact pads 106 to the integrated circuit die 104. For example, the inner bond wire 108 can be an insulated wire, bare wire, such as copper or gold. The entire length of the inner bond wire 108 can be enclosed and embedded within the stacking structure 102. The inner bond wire 108 can initially extend downward from the active side 112 of the integrated circuit die 104. The inner bond wire 108 can bend or loop upward and directly connect to the contact pads 106 on the bottom surface or the surface facing the integrated circuit die 104. The inner bond wire can be located horizontally away from the cavity 110.

The stacking structure 102 can have top structure surfaces 120, separating portions 122, and a horizontal member 126. The top structure surfaces 120 can be adjacent to the passive side 114 of the integrated circuit die 104.

For illustrative purposes, the top structure surfaces 120 are shown planar to, at the same height as, and having the same size as each other, and planar to the passive side 114. However, it is understood that the stacking structure 102 can be shaped differently. For example, the top structure surfaces 120 can be slanted or have different height and size from each other, or non-planar to the passive side 114.

The separating portions 122 can be between the integrated circuit die 104 and the contact pads 106. The separating portions 122 can directly contact the integrated circuit die 104 and the contact pads 106. The separating portions 122 can electrically and physically isolate the integrated circuit die 104 from the contact pads 106. The separating portions 122 can vertically extend downward from the top structure surfaces 120 down to the bottom surface of the integrated circuit die 104 or the contact pad 106.

The horizontal member 126 is a horizontal portion of the cavity 110 that is between the top structure surfaces 120, at a height that is between the top structure surfaces 120 and the bottom of the stacking structure 102. The horizontal member 126 can be in contact with the active side 112 of the integrated circuit die 104 and provide support to the integrated circuit die 104. Alternatively, an adhesive layer may be placed between the integrated circuit die 104, on the active side 112 and the stacking structure 102 to attach the stacking structure 102 and the integrated circuit die 104.

On the side opposite to the active side 112, the horizontal member 126 can provide the boundary for the cavity 110. The cavity 110 can be located between the separating portions 122. The horizontal member 126 can hold the integrated circuit die 104 is situated higher than the contact pads 106.

More specifically, the integrated circuit die 104 can be in the interior portion of the stacking structure 102. The stacking structure 102 can surround the integrated circuit die 104, such that the stacking structure 102 is in contact with and covering the peripheral sides of the integrated circuit die 104.

For illustrative purposes, the integrated circuit die 104 is shown in the center of the stacking structure 102 and covering the peripheral sides of the integrated circuit die 104. However, it is understood that the integrated circuit die 104 and the stacking structure 102 can be arranged in other ways. For example, the integrated circuit die 104 can be at an off-center location on the stacking structure 102, such as on the left portion or on the corner portion of the stacking structure 102. Also, for example, the stacking structure 102 can expose all or portions of the peripheral sides on the integrated circuit die 104.

Also, for illustrative purposes, the integrated circuit packaging system 100 is shown having a single die in the stacking structure 102. However, it is understood that the integrated circuit packaging system 100 can be different. For example, the stacking structure 102 can have multiple chips of same or different sizes imbedded therein.

The integrated circuit packaging system 100 can be used as a single independent package or in a stacked package configuration. In stacked package configuration, the integrated circuit packaging system 100 can be an internal stacking module, such as a leadframe internal stacking module for package in package systems.

It has been discovered that the integrated circuit packaging system 100 provides improved reliability. The stacking structure 102 affixing and exposing the contact pads 106 that are connected to the integrated circuit die 104 give rise to the reliability since the system can be tested before being integrated with other components or systems.

It has further been discovered that the integrated circuit packaging system 100 provides improved reliability and durability. The inner bond wire 108 embedded within the stacking structure 102 give rise to the reliability and durability by protecting the connection during handling of the system.

It has also been discovered that the integrated circuit packaging system 100 provides lower overall profile. The stacking structure 102 having the cavity 110 and the contact pads 106 provide the lower profile by allowing for molding channels and allowing for the integrated circuit packaging system 100 to be mounted over existing components or circuitry.

Figure 2:
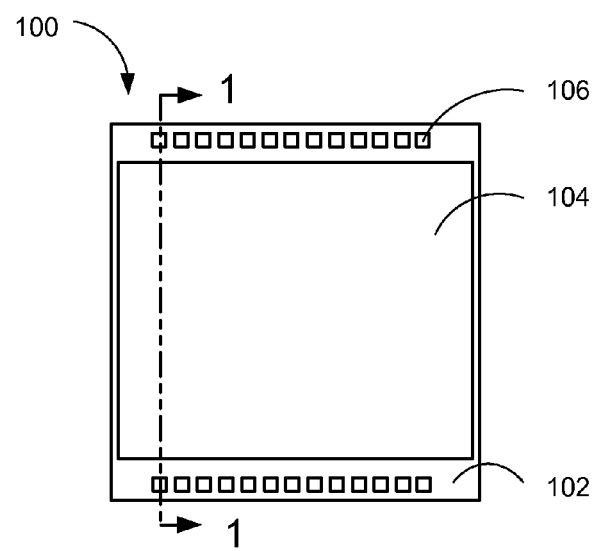
FIG. 2 is a top view of the integrated circuit packaging system in a first embodiment of the present invention with the line 1-1 for the cross-section view of FIG. 1.

Referring now to FIG. 2, therein is shown a top view of the integrated circuit packaging system 100 in a first embodiment of the present invention with the line 1-1 for the cross-section view of FIG. 1. The stacking structure 102 can have the contact pads 106 arranged in a single row each on opposing sides of the stacking structure 102. The integrated circuit die 104 can be between the two rows of the contact pads 106.

Alternatively, the contact pads 106 can surround the integrated circuit die 104 along the peripheral sides. The contact pads can also be arranged in multiple rows, either aligned to form columns or staggered.

For illustrative purposes, the integrated circuit packaging system 100 is shown having the contact pads 106 arranged in a single row on opposing sides of the stacking structure 102. However, it is understood that the integrated circuit packaging system 100 can have a different arrangement of the contact pads as discussed above.

Figure 3:
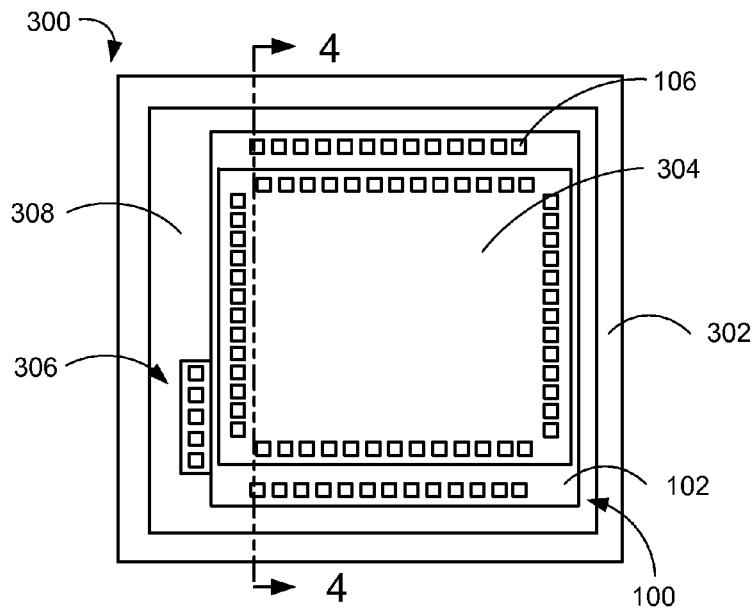
FIG. 3 is a top plan view of an integrated circuit packaging system in a second embodiment of the present invention with a top portion removed.

Referring now to FIG. 3, therein is shown a top plan view of an integrated circuit packaging system 300 in a second embodiment of the present invention with a top portion removed. The integrated circuit packaging system 300 includes the integrated circuit packaging system 100 as an internal stacking module.

The integrated circuit packaging system 300 has the integrated circuit packaging system 100 having the stacking structure 102, the integrated circuit die 104 of FIG. 1, the contact pads 106, and the inner bond wire 108 of FIG. 1. The components and structure of the integrated circuit packaging system 100 has been described above in reference to FIG. 1.

The integrated circuit packaging system 100 can be mounted on a substrate 302. The substrate 302 is a body or base layer, onto which other layers and components can be attached. The substrate 302 can be many different forms, such as laminate substrate, glass, aluminum oxide, or printed circuit board (PCB). The details for mounting the integrated circuit packaging system 100 on the substrate 302 will be discussed below.

The integrated circuit packaging system 300 can also include a top chip 304, a bottom chip 306, and an encapsulation 308. The top chip 304, the bottom chip 306, or both can be an integrated circuit die or a populated PCB. The bottom chip 306 can be on top of the substrate 302 with the stacking structure 102 mounted over the bottom chip 306 and the top chip 304 can be on top of the stacking structure 102.

For illustrative purposes, the stacking structure 102 is shown covering a portion of the bottom chip 306. However, it is understood that the stacking structure 102 can cover all of the bottom chip 306 such that the bottom chip 306 would not be seen in a top view.

Also, for illustrative purposes, the top chip 304 is shown in the center of the stacking structure 102 and covering most of the stacking structure 102 and all of the integrated circuit die 104. However, it is understood that the top chip 304 can be of a different size, smaller or larger than the stacking structure 102, and be located differently, such as on one side or at the corner of the stacking structure 102. For example, the top chip 304 can be ⅓ of the currently shown size and located in the upper left hand corner, as currently shown, of the stacking structure 102, and thus exposing the integrated circuit die 104 underneath. Also, for example, the integrated circuit packaging system 300 can have four integrated circuit dies, each less than ¼ of the top chip 304 as currently shown, located at each of the four corners of the stacking structure 102.

The encapsulation 308 is a structure that encapsulates or surrounds components to prevent physical damage or corrosion. The encapsulation 308 can be made of materials such as ceramic, plastic, or epoxy. The encapsulation 308 can be on top of the substrate 302 and encapsulates the top chip 304, the integrated circuit packaging system 100, and the bottom chip 306.

Figure 4:
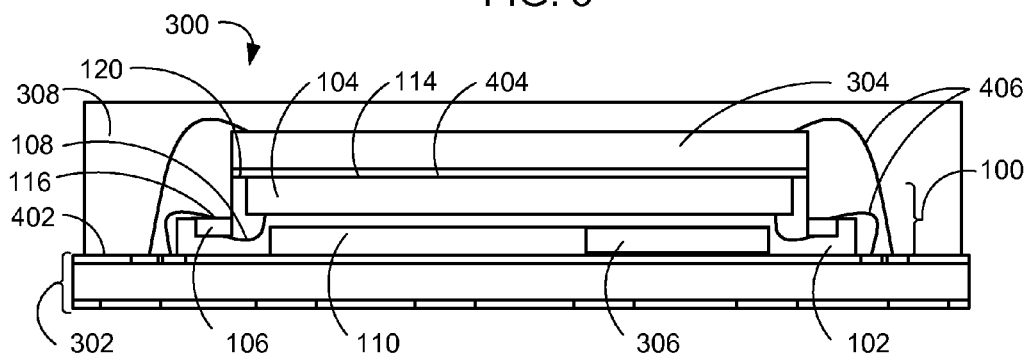
FIG. 4 is a cross-sectional view of the integrated circuit packaging system along line 4-4 of FIG. 3.

Referring now to FIG. 4, therein is shown a cross-sectional view of the integrated circuit packaging system 300 along line 4-4 of FIG. 3. The cross-sectional view shows the integrated circuit packaging system 300 having the integrated circuit packaging system 100.

The integrated circuit packaging system 100 has the stacking structure 102, the integrated circuit die 104, the contact pads 106, and the inner bond wire 108. The components and structure of the integrated circuit packaging system 100 has been described above in reference to FIG. 1.

The integrated circuit packaging system 100 can be mounted on the substrate 302. The mounting can be done by attaching the stacking structure 102 to a top surface 402 of the substrate 302. The stacking structure 102 can be attached to the top side with an adhesive layer 404.

The bottom chip 306 can be attached to the top surface 402 of the substrate 302 and the integrated circuit packaging system 100 can be mounted over the bottom chip 306 such that a portion or all of the bottom chip 306 is covered within the cavity 110.

The stacking structure 102 can be mounted with the passive side 114 of the integrated circuit die 104 and the top side 116 of the contact pads 106 facing the same direction as the top surface 402 of the substrate 302. The stacking structure 102 can be mounted on the substrate 302 and over the bottom chip 306, with the bottom chip within the cavity 110.

It has been discovered that the present invention provided the integrated circuit packaging system 100 having reduced warpage. The stacking structure 102 and the substrate 302 give rise to the benefit by being directly attached to each other. Since the stacking structure 102 is directly attached to the substrate 302 and not to a spacer, the contact surface between the stacking structure 102 and the substrate 302 can be increased to increase the adhesion.

The integrated circuit packaging system 100 can also have the adhesive layer 404 attaching the top chip 304 and the integrated circuit packaging system 100. For example, the adhesive layer 404 can be epoxy or dielectric adhesive compound.

The adhesive layer 404 can be on the passive side 114 of the integrated circuit die 104, the top structure surfaces 120, or a combination thereof. The adhesive layer 404 can be between the top chip 304 and the integrated circuit packaging system 100.

The integrated circuit packaging system 300 can have outer bond wires 406 connecting the top chip 304 and the substrate 302. The outer bond wires 406 can also connect the integrated circuit packaging system 100 and the substrate 302.

The outer bond wires 406 can be similar to the inner bond wire 108 and relay electrical signals to and from the top chip or to and from the integrated circuit packaging system 100. Similar to the inner bond wire 108, the outer bond wires 406 can be an insulated wire or a trace, lead, or film made of conductive materials, such as gold or aluminum. The outer bond wires 406 can connect to a conductive portion on the substrate 302, such as a contact pad or a trace.

The bottom chip 306, the integrated circuit packaging system 100, the adhesive layer 404, the top chip 304, and the outer bond wires 406 can all be encapsulated in the encapsulation 308. The encapsulation 308 can be formed on the top surface 402 of the substrate 302 and completely encase and cover the bottom chip 306, the integrated circuit packaging system 100, the adhesive layer 404, the top chip 304, and the outer bond wires 406. The encapsulation 308 can be formed by a molding process.

The encapsulation 308 can affix the bottom chip 306, the integrated circuit packaging system 100, and the outer bond wires 406 in place. In other embodiments, adhesives can be added between the bottom chip 306 and the substrate 302, between the bottom chip 306 and the integrated circuit packaging system 100, between the integrated circuit packaging system 100 and the substrate 302, or a combination thereof.

It has been discovered that the present invention provides the integrated circuit packaging system 100 that is both cheaper and easier to manufacture. The stacking structure 102 gives rise to the benefit by eliminating the need for spacers or adhesives between the stacking structure 102 and the bottom chip 306.

It has also been discovered that the present invention provided the integrated circuit packaging system 100 having lower profile. The stacking structure 102 and the inner bond wire 108 embedded therein give rise to the benefit by eliminating the need to secure loop heights of bonded wires of chips.

Since the inner bond wire 108 is encapsulated within the stacking structure 102, the possibility of the inner bond wire 108 contacting other components or being damaged during manufacturing has been eliminated. Thus, the inner bond wire 108 is encapsulated within the stacking structure 102 eliminates the need to secure loop heights.

Also, the stacking structure 102 mounted directly on the substrate 302 reduces the overall package profile.

Figure 5:
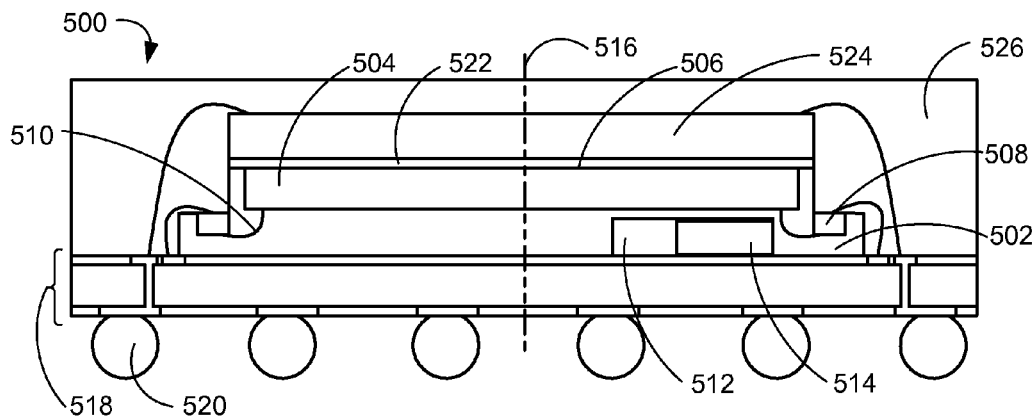
FIG. 5 is a cross-sectional view of an integrated circuit packaging system in a third embodiment of the present invention.

Referring now to FIG. 5, therein is shown a cross-sectional view of an integrated circuit packaging system 500 in a third embodiment of the present invention. The integrated circuit packaging system 500 is similar to the integrated circuit packaging system 300.

The integrated circuit packaging system 500 can have a stacking structure 502, an integrated circuit die 504, which has a passive side 506, a contact pad 508, and an inner bond wire 510. The stacking structure 502, the integrated circuit die 504, the contact pad 508, and the inner bond wire 510 together constitutes the integrated circuit packaging system 100 of FIG. 3. The stacking structure 502 can be a solid structure that holds the integrated circuit die 504 in place, made of materials such as molded plastic, epoxy, or resin, or other materials such as ceramic, metal, or composite materials.

The integrated circuit die 504 can be connected to the contact pad 508 via the inner bond wire, such as bare copper lead or insulated wire. The stacking structure 502 can be integrally formed around the integrated circuit die 504, the contact pad 508, and the inner bond wire 510 and affix the components. The method for forming the stacking structure 502 will be discussed in detail below.

The stacking structure 502 can have a cavity 512, a space formed by recessed portions of the stacking structure 502, on the side opposite to the integrated circuit die 504.

The cavity can be at an off-center location, such that the center point of the cavity 512 is and a bottom chip 514 are not aligned with a center line 516 that runs through the middle point of the integrated circuit die 504. The cavity 512 can cover the bottom chip 514 partially or wholly such that the bottom chip 514 is between the stacking structure 502 and a substrate 518, such as a laminate substrate or a Ball-Grid Array. The stacking structure 502 can be mounted on top of the substrate 518. The substrate 518 can have solder balls 520 formed thereon.

An adhesive layer 522, such as epoxy or dielectric adhesive material, can be attached to the passive side 506 of the integrated circuit die 504 and also affix a top chip 524 to the integrated circuit die 504, the stacking structure 502, or a combination thereof. An encapsulation 526, such as plastic, epoxy, or resin, can be formed on top of the substrate 518 and encapsulating the entire structure. The encapsulation 526 can affix the structure as a whole or between the individual components, such as between the bottom chip 514 and the stacking structure 502 or between the stacking structure 502 and the substrate 518.

It has been discovered that the present invention provided the integrated circuit packaging system 100 having higher weight bearing capability without increasing the size of the inter-stack module. The stacking structure 502 having the cavity 512 at an off-center location gives rise to the benefit by extending the molding portion of the stacking structure 502 underneath the integrated circuit die 504 and the top chip 524. Extending the molding portion increases the weight bearing capability without increasing the overall size of the stacking structure 502 and allows for stacking bigger, and thus heavier, integrated circuit chips without increasing the cost, material, manufacturing steps and the complexity of the steps, or the overall profile of the stacked package.

Figure 6:
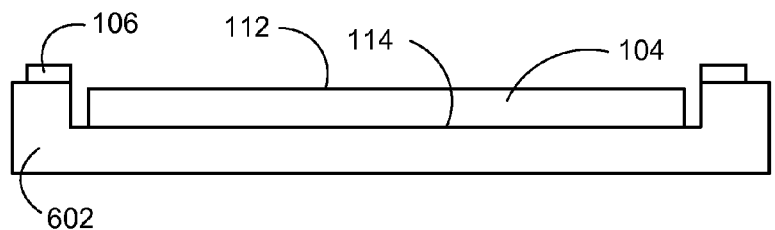
FIG. 6 is components arranged for manufacturing the various embodiments of the present invention.

Referring now to FIG. 6, therein is components arranged for manufacturing the various embodiments of the present invention. The integrated circuit die 104 and the contact pads 106 are attached to a processing frame 602. The processing frame 602 is a frame that can hold the components in place during the manufacturing process. The processing frame 602 can be composed of metal, such as copper or aluminum, plastic, epoxy, or a composite material. For example, the processing frame 602 can be a lead frame or a die paddle.

The processing frame 602 can have a designated shape. For example, the processing frame 602 can have the integrated circuit die 104 and the contact pads 106 oriented in the same direction. The processing frame 602 can be in contact with the passive side 114 and the active side 112 exposed. The processing frame 602 can have a gap between itself and the peripheral sides of the integrated circuit die 104.

For illustrative purposes, the integrated circuit die 104 is shown as being in the middle of the processing frame 602 and having equal size gaps around the peripheral sides of the integrated circuit die 104. However, it is understood that the arrangement can be different. For example, the integrated circuit die 104 can be arranged off-center on the processing frame 602, with unequal gaps surrounding the peripheral sides of the integrated circuit die 104.

Also, for illustrative purposes, the integrated circuit die 104 and the contact pads 106 are shown as having parallel orientation, with all occurrences of the contact pads 106 at the same height and above the integrated circuit die 104. However, it is understood that the contact pads 106 and the integrated circuit die 104 can be arranged differently. For example, either the top surface or the bottom surface of the contact pads 106 can be planar to the active side 112 or the passive side 114, or the contact pads 106 can be below the integrated circuit die 104. Also, for example, different occurrences of the contact pads 106 can be of different height and orientation from each other and have a different orientation from the integrated circuit die 104.

Figure 7:
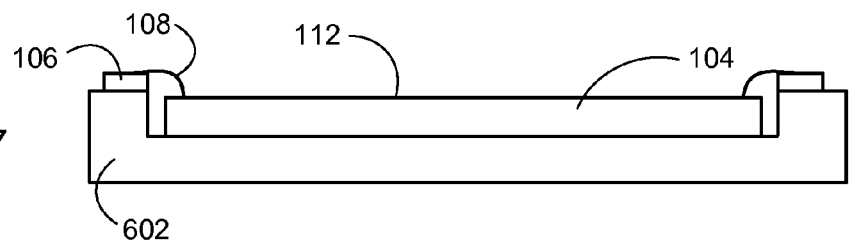
FIG. 7 is the structure of FIG. 6 after connecting the inner bond wire of FIG. 1.

Referring now to FIG. 7, therein is shown the structure of FIG. 6 after connecting the inner bond wire 108 of FIG. 1. The inner bond wire 108 can be connected from any of the exposed surfaces of the contact pads 106 to the active side 112 of the integrated circuit die 104.

Figure 8:
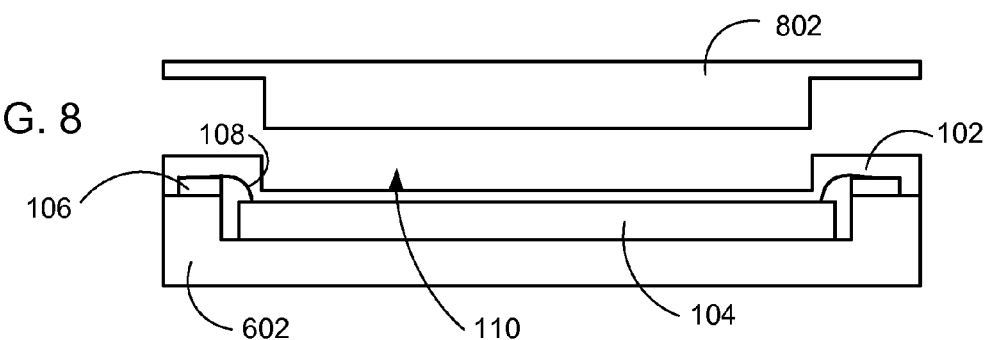
FIG. 8 is the structure of FIG. 7 after molding the stacking structure of FIG. 1.

Referring now to FIG. 8, therein is shown the structure of FIG. 7 after molding the stacking structure 102 of FIG. 1. The designated material for the stacking structure 102 can be placed or flowed on top of the processing frame 602, and on top and around the contact pads 106 and the integrated circuit die 104. The material can also surround the inner bond wire 108 and can be shaped to form the stacking structure 102 using a shaping frame 802. For example, the shaping frame 802 can be a mold chase, a cutting blade, or a laser etcher. The shaping frame 802 can also create the cavity 110 in the stacking structure 102.

In other embodiments, the bottom chip 306 of FIG. 3 can be used to form the stacking structure 102. For example, the bottom chip 306 can be attached to the shaping frame 802. The bottom chip 306 can be detached from the shaping frame 802 after the stacking structure 102 is formed and before removing the shaping frame 802. Also, for example, the bottom chip 306 can be used to form the cavity 110. The stacking structure 102 can be molded around the bottom chip 306 to form the cavity 110.

Figure 9:
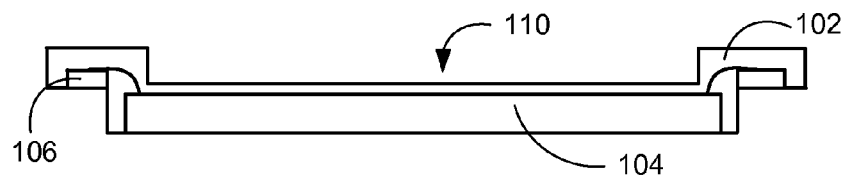
FIG. 9 is the structure of FIG. 8 singulated to form the integrated circuit packaging system of FIG. 1.

Referring now to FIG. 9, therein is shown the structure of FIG. 8 singulated to form the integrated circuit packaging system 100 of FIG. 1. After forming the stacking structure 102, the processing frame 602 of FIG. 6 can be removed. The processing frame 602 can be removed by cooling the processing frame 602 to take advantage of the different expanding rates in different metals. The processing frame 602 can also be removed by chemical or laser etching process. The stacking structure 102 can then be singulated.

The resulting structure is the integrated circuit packaging system 100. The resulting system is also referred to as the integrated circuit packaging system 100.

It has been discovered that the present invention provided the integrated circuit packaging system 100 manufactured through a simpler and thus cheaper process. The use of the processing frame 602 and the shaping frame 802 of FIG. 8 in molding or forming the stacking structure 102 eliminates the need for a die pad. Eliminating the die pad reduces the number of steps, the necessary tools, and the material necessary for manufacturing stacked integrated circuit packages, thus giving rise to the benefit.

It has also been discovered that the present invention provided the integrated circuit packaging system 100 that has finer granularity between the contact pads and improved signal separation. The stacking structure 102 that can form in between the contact pads gives rise to the benefit by forming between narrower gaps between the contact pads. The insulating properties of the material for the stacking structure 102 can prevent the flow or shorts that can occur between the contact pads.

It has further been discovered that the present invention provided the integrated circuit packaging system 100 having custom fit components, resulting in increased durability and flexibility. The stacking structure 102 and the integrated circuit die 104 give rise to the benefit by having a custom fit between the two and eliminating the need for adhesives or intermediate encapsulations. Forming the stacking structure 102 around the integrated circuit die 104 ensures a tight fit that is customized to the distinct shape and size of the integrated circuit die 104.

The simplicity in custom fitting the integrated circuit die 104 to the stacking structure 102 increases the flexibility of using various different sizes of the integrated circuit die 104 without changing the manufacturing process. Also, the tight fit between the integrated circuit die 104 and the stacking structure 102 eliminates the need for adhesives, thus reducing cost, and decreases the potential of the integrated circuit die 104 being moved, thus increasing durability.

Furthermore, the same benefits can be extended to the bottom chip 306 of FIG. 3 when the bottom chip 306 is used as, or in combination with, the processing frame 602 to create the cavity 110. The same custom fit and the resulting benefits can exist for the bottom chip 306 and the integrated circuit die 104 with the stacking structure 102.

Figure 10:
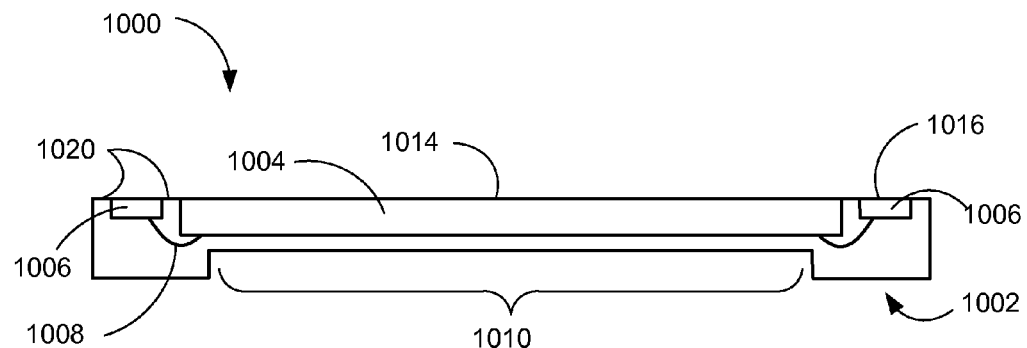
FIG. 10 is a cross-sectional view of an integrated circuit packaging system in a fourth embodiment of the present invention.

Referring now to FIG. 10, therein is shown a cross-sectional view of an integrated circuit packaging system 1000 in a fourth embodiment of the present invention. The integrated circuit packaging system 1000 has a stacking structure 1002, an integrated circuit die 1004, contact pads 1006, and an inner bond wire 1008.

The integrated circuit packaging system 1000 can be similar to the integrated circuit packaging system 100 of FIG. 1. For example, the stacking structure 1002, the integrated circuit die 1004, the contact pads 1006, and the inner bond wire 1008 can be similar to or same as in the integrated circuit packaging system 100.

More specifically, the stacking structure 1002 can be a solid structure that holds the integrated circuit die 1004 in place, made from various materials. For example, the stacking structure 1002 can be formed by molding plastic, epoxy, or resin type of material. The stacking structure 1002 can be formed around the integrated circuit die 1004, the contact pads 106, and the inner bond wire 1008. The stacking structure 1002 can have a cavity 1010 on the opposite side of the integrated circuit die 1004. The stacking structure 1002 can have the cavity 1010 similar to the cavity 110 of FIG. 1.

The integrated circuit packaging system 1000 can be different from the integrated circuit packaging system 100 in that a passive side 1014, top structure surfaces 1020, and a top side 1016 of the contact pad 1006 can all be planar, similar to the arrangement of the integrated circuit packaging system 100. The inner bond wire 1008 can be looped up higher to accommodate the rise in height of the contact pad 1006 between the integrated circuit packaging system 1000 and the integrated circuit packaging system 100.

It has been discovered that the integrated circuit packaging system 1000 provides improved reliability and flexibility for lower cost. The stacking structure 1002 affixing the contact pads 1006 and the integrated circuit die 1004, and together forming a planar surface give rise to the benefits.

A flat surface can be used to arrange the contact pads 1006 and the integrated circuit die 1004. Forming the stacking structure 1002 around the contact pads 1006 and the integrated circuit die 1004 arranged on the flat surface eliminates the need for a customized die to form customized shapes for providing custom fit for the contact pads 1006 and the integrated circuit die 1004. Thus, the planar arrangement of the stacking structure 1002, the contact pads 1006, and the integrated circuit die 1004 eliminates customized molds, reducing the manufacturing cost, while preserving the custom fit between the contact pads 1006 and the integrated circuit die 1004 with more standard mold shapes.

Figure 11:
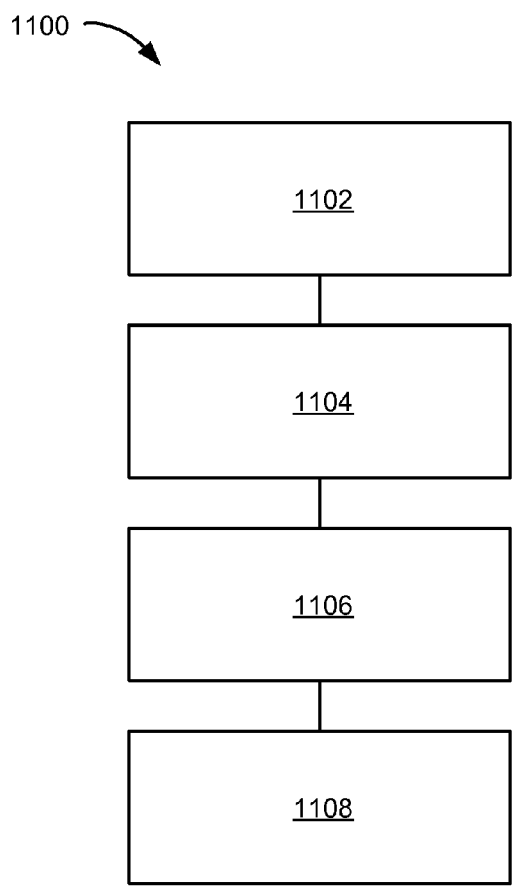
FIG. 11 is a flow chart of a method for manufacture of the integrated circuit packaging system in a further embodiment of the present invention.

Referring now to FIG. 11, therein is shown a flow chart of a method 1100 for manufacture of the integrated circuit packaging system 100 in a further embodiment of the present invention. The method 1100 includes providing an integrated circuit die having an active side and a passive side in a block 1102; providing a contact pad having a top side oriented in a same direction as the passive side in a block 1104; connecting an inner bond wire to the contact pad and the integrated circuit die in a block 1106; and molding a stacking structure around the contact pad, the inner bond wire, and the integrated circuit die with the passive side and the top side exposed, and the stacking structure having a top structure surface on top and adjacent to or below the integrated circuit die, and a horizontal member under the integrated circuit die and forming a cavity in a block 1108.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit packaging system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit packaging system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacture of an integrated circuit packaging system comprising:
   providing an integrated circuit die having an active side facing down and a passive side facing up;
   providing a contact pad having a top side facing up;
   connecting an inner bond wire to the contact pad and the active side of the integrated circuit die with the inner bond wire extending downward from the active side and bending upward;
   molding a stacking structure around the contact pad, the inner bond wire, and the integrated circuit die with the passive side and the top side exposed, and the stacking structure having a top structure surface on top and adjacent to or below the integrated circuit die, and a horizontal member under the integrated circuit die and forming a cavity;
   fabricating a substrate having a top surface for mounting the stacking structure and the integrated circuit die;
   attaching a bottom chip on the top surface;
   mounting the stacking structure on the top surface and over the bottom chip, with a portion of the bottom chip within the cavity;
   attaching a top chip to the passive side of the integrated circuit die; and
   forming an encapsulation on the top surface of the substrate to enclose the top chip, the stacking structure, and the bottom chip.

2. The method as claimed in claim 1 further comprising:
   attaching an outer bond wire between the substrate and the top chip; and wherein:
   forming an encapsulation includes enclosing the outer bond wire.

3. The method as claimed in claim 1 wherein molding the stacking structure includes arranging the top side of the contact pad and the passive side of the integrated circuit die to be planar.

4. The method as claimed in claim 1 wherein:
   molding the stacking structure includes attaching the integrated circuit die to the stacking structure; and
   stacking the stacking structure over the bottom chip includes attaching a portion or all of the bottom chip to the cavity.

5. The method as claimed in claim 1 wherein molding the stacking structure includes forming the cavity at an off-center location within the stacking structure.

* * * * *